United States Patent
Yang et al.

(10) Patent No.: US 9,665,140 B2
(45) Date of Patent: May 30, 2017

(54) ELECTRICAL DEVICE HAVING THERMAL ISOLATION FUNCTION

(71) Applicant: Quanta Computer Inc., Taoyuan Shien (TW)

(72) Inventors: Sung-Fong Yang, Taipei (TW); Chang-Chun Lan, New Taipei (TW); Yu-Nien Huang, Zhongli (TW); Shun-Ta Yu, Taipei (TW); Wei-Che Yeh, Miaoli (TW)

(73) Assignee: Quanta Computer Inc., Guishan Dist., Tauyuan (TW)

( * ) Notice: Subject to any disclaimer, the term of this patent is extended or adjusted under 35 U.S.C. 154(b) by 52 days.

(21) Appl. No.: 14/519,640

(22) Filed: Oct. 21, 2014

(65) Prior Publication Data

US 2015/0277519 A1    Oct. 1, 2015

(30) Foreign Application Priority Data

Mar. 27, 2014 (TW) .............................. 103111526 A

(51) Int. Cl.
*G06F 1/20* (2006.01)
*H05K 7/20* (2006.01)

(52) U.S. Cl.
CPC .......... *G06F 1/203* (2013.01); *H05K 7/20154* (2013.01)

(58) Field of Classification Search
CPC .......... G06F 1/203; G06F 1/20; G06F 1/1613; G06F 1/1616; G06F 1/1633; G06F 1/206; H05K 7/20154; H05K 7/20; H05K 7/20172; H05K 7/20209; H05K 7/20163; H05K 7/20963; H05K 7/20972; H05K 7/20336; F28D 15/0266; H01L 23/427
USPC ..... 361/679.78, 679.54, 690, 695, 696, 697, 361/676, 679.46, 703, 831, 679.47, 361/679.52, 718, 704, 701, 702, 677, 361/679.48
See application file for complete search history.

(56) References Cited

U.S. PATENT DOCUMENTS 5,559,674 A * 9/1996 Katsui ..................... H01L 23/40
165/121
2003/0043541 A1* 3/2003 Yuasa ..................... A01N 25/10
361/679.54

(Continued)

FOREIGN PATENT DOCUMENTS

TW    200832123 A    8/2008
TW    200847913 A    12/2008

(Continued)

*Primary Examiner* — Jerry Wu
*Assistant Examiner* — Stephen Sul
(74) *Attorney, Agent, or Firm* — Rabin & Berdo, P.C.

(57) ABSTRACT

An electrical device having thermal isolation function includes a housing, a heat-generating source, a heat-conductive member, and a thermal isolation plate. The housing includes an accommodation space therein, an inner surface and an outer surface which is opposite to the inner surface. The heat-generating source is disposed in the accommodation space. The heat-conductive member is disposed in the accommodation space, and is in contact with the heat-generating source. The thermal isolation plate is disposed between the heat-conductive member and the inner surface of the housing, and the thermal isolation plate is formed with a vacuum chamber therein.

6 Claims, 9 Drawing Sheets

(56) References Cited

U.S. PATENT DOCUMENTS

| | | | |
|---|---|---|---|
| 2006/0024469 A1* | 2/2006 | Tenra | E04B 1/803 428/69 |
| 2006/0256517 A1* | 11/2006 | Taylor | G06F 1/203 361/679.54 |
| 2010/0073864 A1* | 3/2010 | Hwang | G06F 1/203 361/679.47 |
| 2013/0286292 A1* | 10/2013 | Yamaguchi | G06F 1/203 348/725 |
| 2014/0092559 A1* | 4/2014 | Yamaguchi | H05K 7/20336 361/700 |
| 2015/0085442 A1* | 3/2015 | Kondo | G06F 1/20 361/679.54 |

FOREIGN PATENT DOCUMENTS

| | | |
|---|---|---|
| TW | M426511 U | 4/2012 |
| TW | M463382 U | 10/2013 |

\* cited by examiner

ELECTRICAL DEVICE HAVING THERMAL ISOLATION FUNCTION

RELATED APPLICATIONS

This application claims priority to Taiwan application No. 103111526, filed, Mar. 27, 2014, the entirety of which is incorporated herein by reference.

BACKGROUND

Technical Field

The present disclosure relates to an electrical device. More particularly, the present disclosure relates to an electrical device having thermal isolation function.

Description of Related Art

Portable electrical devices (e.g., laptop computers, tablet computers or smart mobile phones) basically are all designed to be flat for portability. Interior spaces of the portable electrical devices are therefore reduced, which limits the installation space for electronic components, e.g., central process unit (CPU), graphic process unit (GPU), random access memory (RAM) etc.

Furthermore, the electronic components generate heat during operation. Even though the portable electrical devices are equipped with heat dissipation module, the heat still may be conducted to outer surfaces of housing of the portable electrical devices, and even burn human skin.

SUMMARY

One aspect of this disclosure is to provide an electrical device having thermal isolation function for overcoming the above-mentioned disadvantages existing in the prior art, that is, by decreasing the possibility of heat being conducted to outer surfaces of the housing, the possibility of human skin being hurt can be reduced.

According to one embodiment of this disclosure, the electrical device having thermal isolation function includes a housing, a heat-generating source, a heat-conductive member, and a thermal isolation plate. The housing comprises an accommodation space therein, an inner surface and an outer surface which is opposite to the inner surface thereof. The heat-generating source is disposed in the accommodation space. The heat-conductive member is disposed in the accommodation space, and is in contact with the heat-generating source. The thermal isolation plate is disposed between the heat-conductive member and the inner surface of the housing, and the thermal isolation plate is formed with a vacuum chamber therein. The vacuum chamber can slow down the heat to the outer surface of the housing via the heat-conductive member.

Therefore, by thermally blocking the heat of the heat-generating source to the outer surface of the housing of the electrical device with the thermal isolation plate, when users contact with the outer surface of the housing of the electrical device, the users will not feel the heat of the heat-generating source so as to prevent the human skin from being hurt.

These and other features, aspects, and advantages of the present disclosure will become better understood with reference to the following description, accompanying drawings and appended claims.

BRIEF DESCRIPTION OF THE DRAWINGS

The present disclosure will be apparent to those skilled in the art by reading the following detailed description of a preferred embodiment thereof, with reference to the attached drawings, in which.

DETAILED DESCRIPTION

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present disclosure. Furthermore, for simplifying the drawings, some of the conventional structures and elements are shown with schematic illustrations.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

Figure 1:
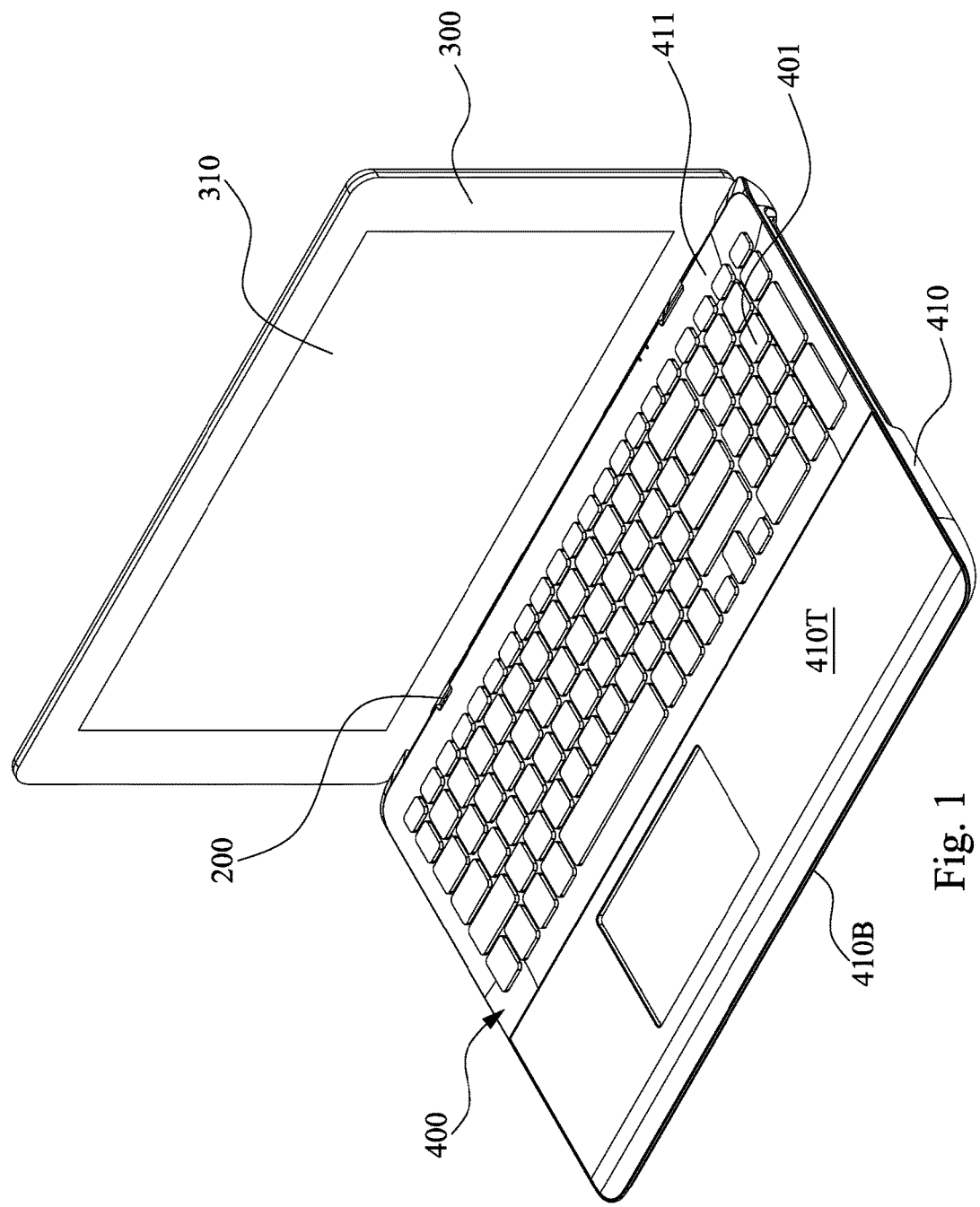
FIG. 1 is a perspective view of an electrical device having thermal isolation function according to one embodiment of the disclosure.
Figure 2:
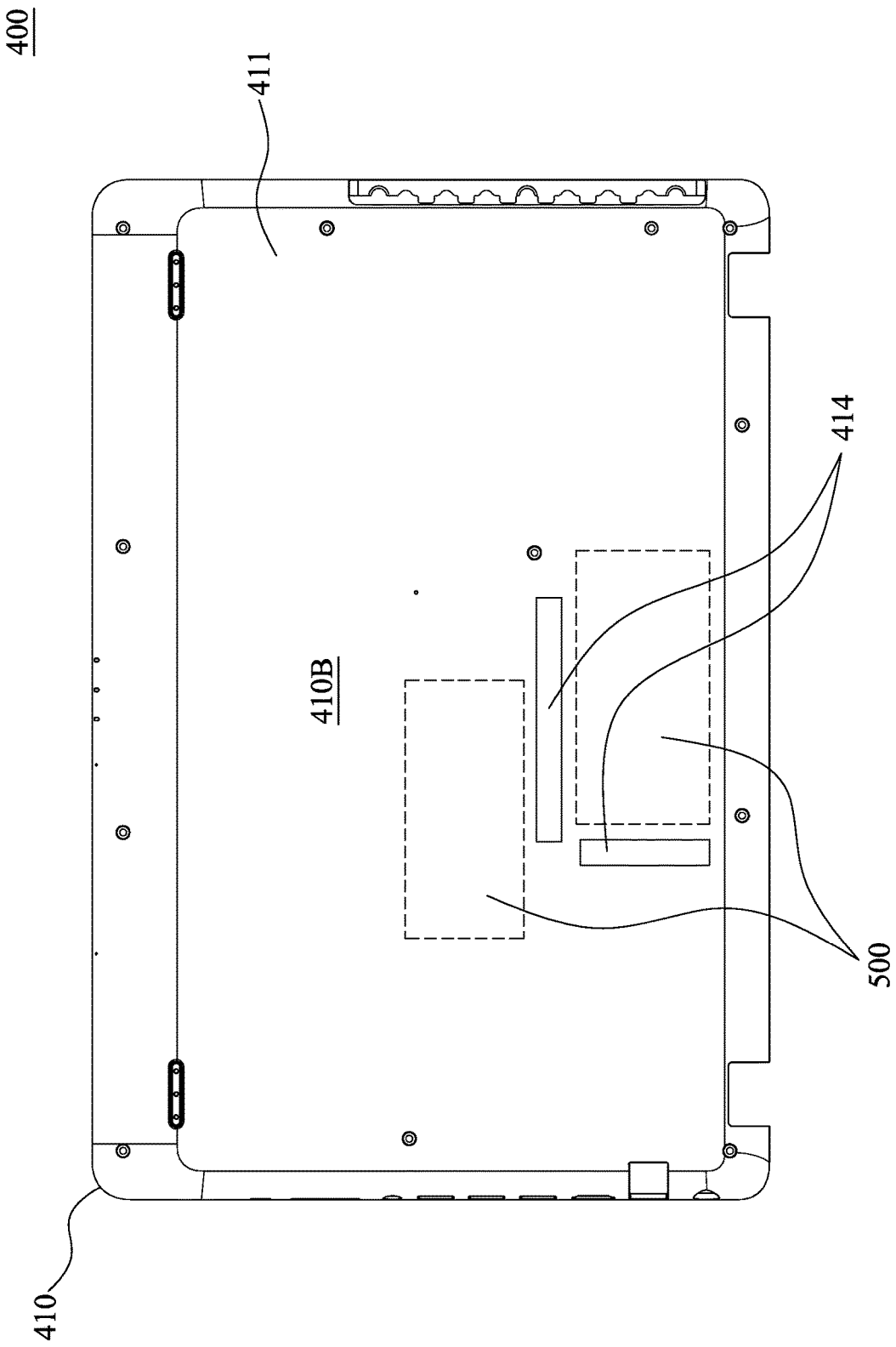
FIG. 2 is a bottom view of a lower unit of FIG. 1.
Figure 3:
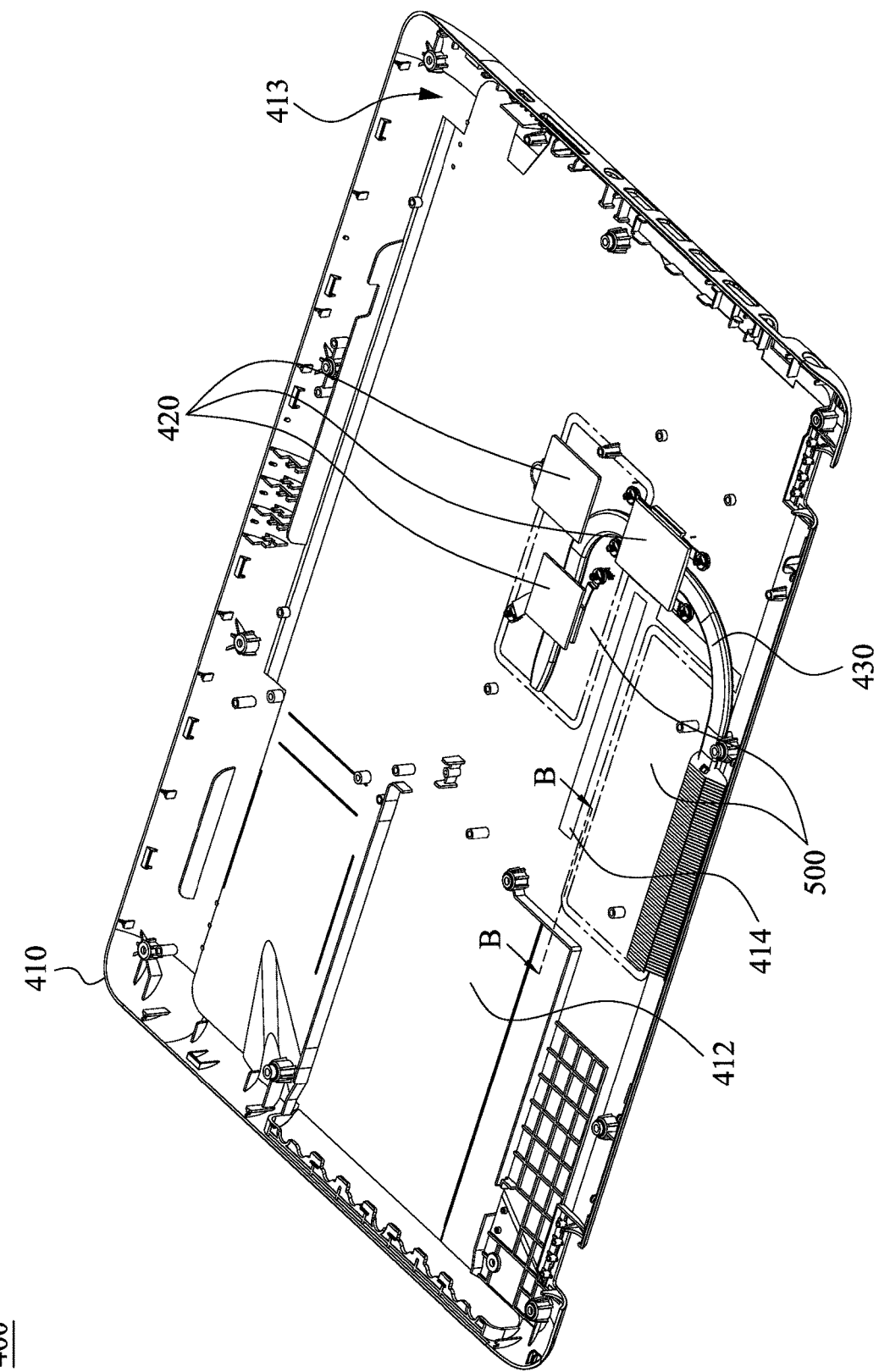
FIG. 3 is a schematic view illustrating a thermal isolation plate and a heat-conductive member observed through a keyboard of the lower unit of FIG. 1.

Reference is now made to FIG. 1 to FIG. 3. FIG. 1 is a perspective view of an electrical device 100 having thermal isolation function according to one embodiment of the disclosure, FIG. 2 is a bottom view of a lower unit 400 of FIG. 1, and FIG. 3 is a schematic view illustrating a thermal isolation plate 500 and a heat-conductive member 430 observed through a keyboard 401 of the lower unit 400 of FIG. 1.

As shown in FIG. 1 to FIG. 3, the electrical device 100 having thermal isolation function of the embodiment includes an upper unit 300, a lower unit 400 and rotary pivots 200. These rotary pivots 200 pivotally couple to the upper unit 300 and the lower unit 400, respectively, and enable the upper unit 300 to pivotally turn relative to the lower unit 400. The upper unit 300 at least has a display panel 310 at one main surface thereof. The lower unit 400 includes a housing 410 and a keyboard 401. The housing 410 includes a top piece 410T and a bottom piece 410B which are opposite to each other (FIG. 2). The keyboard 401 is disposed on the top piece 410T of the housing 410. The bottom piece 410B includes an inner surface 412 and an outer surface 411 which are opposite to each other. The outer surface 411 includes areas of the bottom piece 410B where a user physically touches with skins as the user uses the electrical device 100. An accommodation space 413 is defined between the top piece 410T and the bottom piece 410B of the housing 410, and the accommodation space 413 can receive internal electronic components which can cooperatively work to enable a laptop computer to normally operate, and the internal electronic components for example can be central process units (CPU), graphic process units (GPU), random access memories (RAM), hard disks and the like. Since the internal electronic components will generate heat during operation, thus, each of the internal electronic components also can be called as a heat-generating source 420 hereinafter.

The electrical device 100 further includes a heat-conductive member 430 and at least one thermal isolation plate 500. The heat-conductive member 430 is disposed in the accommodation space 413, and is in contact with the heat-generating sources 420 for conducting the heat generated from the heat-generating sources 420 to the exterior of the electrical device 100.

Each of the thermal isolation plates 500 is in contact with the housing 410, and is disposed between the inner surface 412 of the housing 410 and the heat-conductive member 430 so that the possibility that the heat being conducted to the outer surface 411 of the housing 410 from the heat-conductive member 430 can be decreased. Thus, when the user is in contact with the outer surface 411 of the bottom piece 410B of the housing 410 by palms or legs, the possibility that human skin of the palms or the legs being hurt by the heat of the heat-generating sources through the housing 410 can be reduced.

Figure 4:
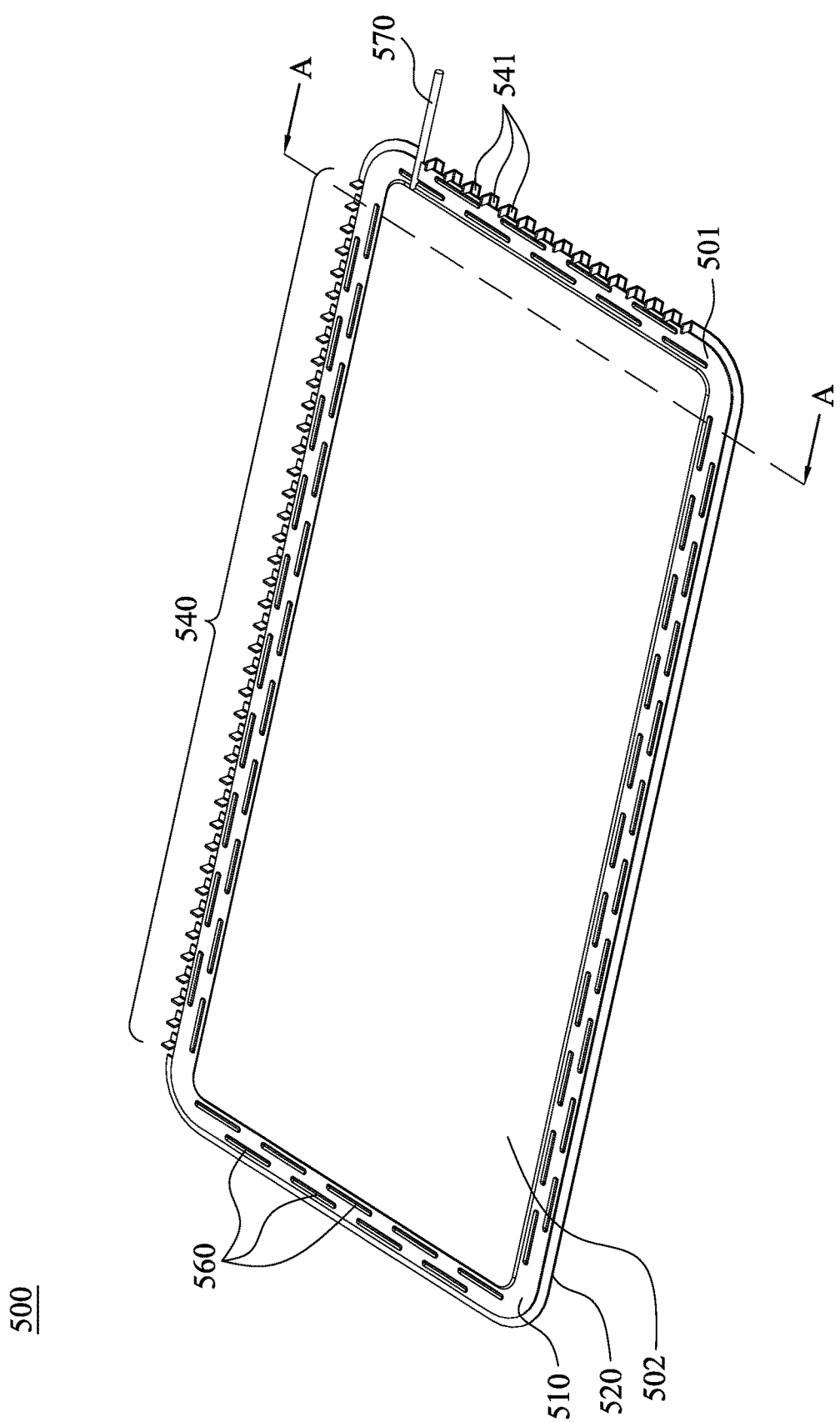
FIG. 4 is a perspective view of a thermal isolation plate of FIG. 1.
Figure 5:
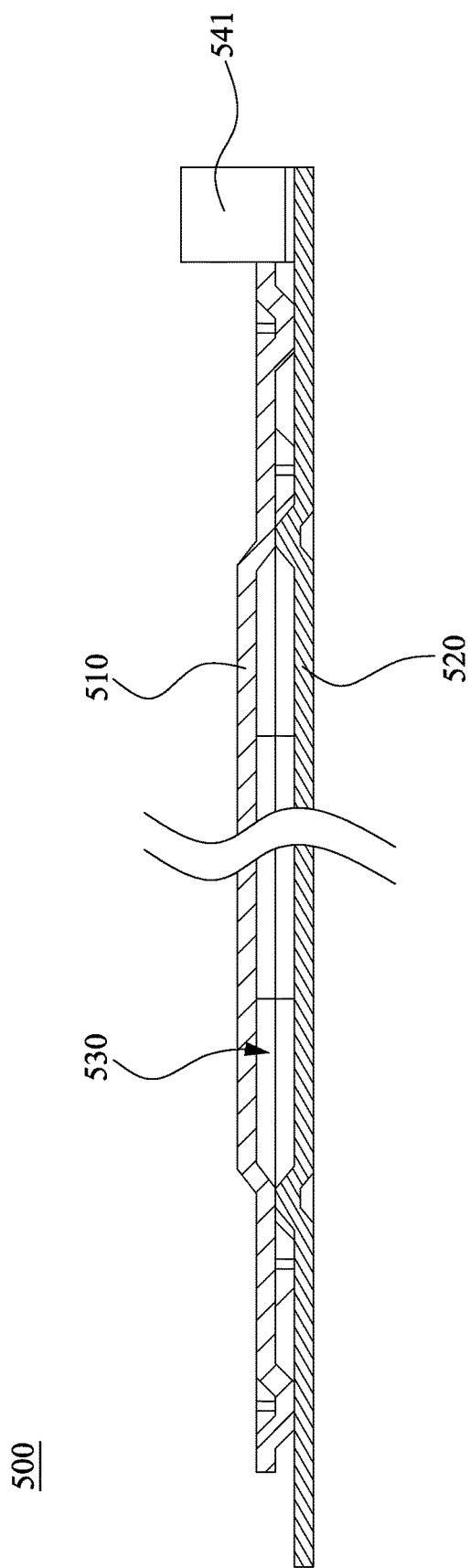
FIG. 5 is a cross sectional view of FIG. 4 taken along line AA.
Figure 6:
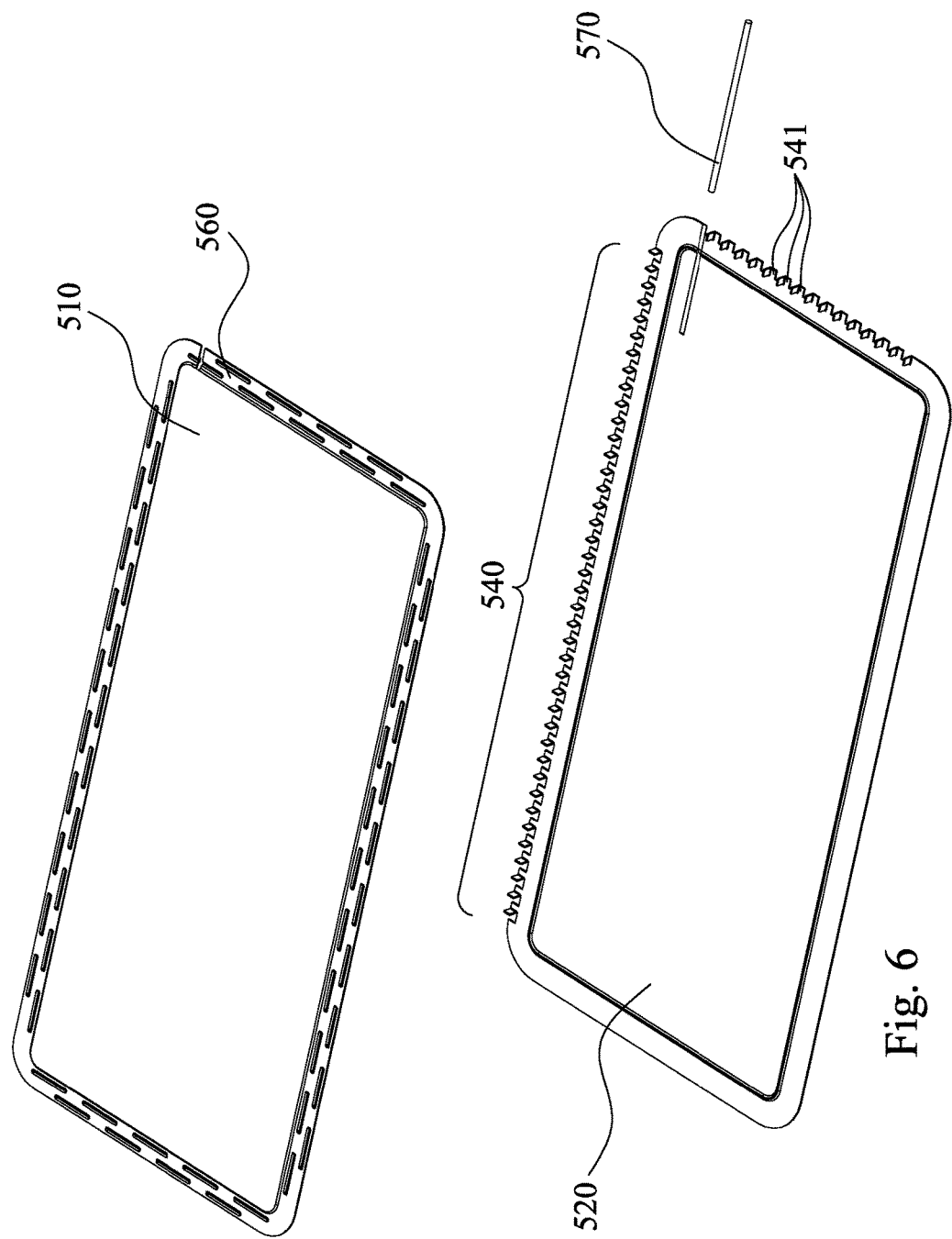
FIG. 6 is an exploded view of the thermal isolation plate of FIG. 4.

Refer to FIG. 4 to FIG. 6, in which FIG. 4 is a perspective view of a thermal isolation plate 500 of FIG. 1, FIG. 5 is a cross sectional view of FIG. 4 taken along line AA, and FIG. 6 is an exploded view of the thermal isolation plate 500 of FIG. 4.

Specifically, the thermal isolation plate 500 includes a first plate body 510 and a second plate body 520. The second plate body 520 is directly attached on the inner surface 412 of the housing 410. Edges of the second plate body 520 and edges of the first plate body 510 are hermetically sealed with each other so that a vacuum chamber 530 is formed between the first plate body 510 and the second plate body 520, and the vacuum chamber 530 slows down the heat to the outer surface 411 of the housing 410 via the heat-conductive member 430.

Since the edges of the second plate body 520 and the edges of the first plate body 510 are hermetically sealed with each other so as to form a single integrated member including two main surfaces 502 and sealing lateral edges 501 mutually surrounding the main surfaces 502 (FIG. 4). Moreover, the thermal isolation plate 500 further includes two fin arrays 540. Each of the fin arrays 540 comprises a plurality of heat radiation fins 541. In one specific embodiment, the heat radiation fins 541 of the fin arrays 540 are arranged on two neighboring lateral edges 501 of the thermal isolation plate 500 at intervals, and the extending directions of the heat radiation fins 541 are substantially perpendicular to the main surfaces 502. However, the disclosure is not limited thereto, in other embodiments, the aforementioned heat radiation fins also can be arranged on one of the main surfaces of the thermal isolation plate facing the heat-conductive member.

In the embodiment, the thermal isolation plate 500 includes high-thermal conductivity material such as metals or carbon compounds or the like. For example, the first plate body 510 and the second plate body 520 are stainless steel metal sheets.

The purpose for using the stainless steel as the first plate body 510 and the second plate body 520 can prevent the inner surfaces of the first plate body 510 and the second plate body 520 from being oxidized to generate internal gas to degrade the effectiveness of vacuum thermal insulation.

It is noted, since each of the first plate body 510 and the second plate body 520 is made of stainless steel, each of the first plate body 510 and the second plate body 520 is convenient to directly fold out the aforementioned fin arrays on the periphery edges of the stainless steel metal sheet by stamping processes.

Figure 7:
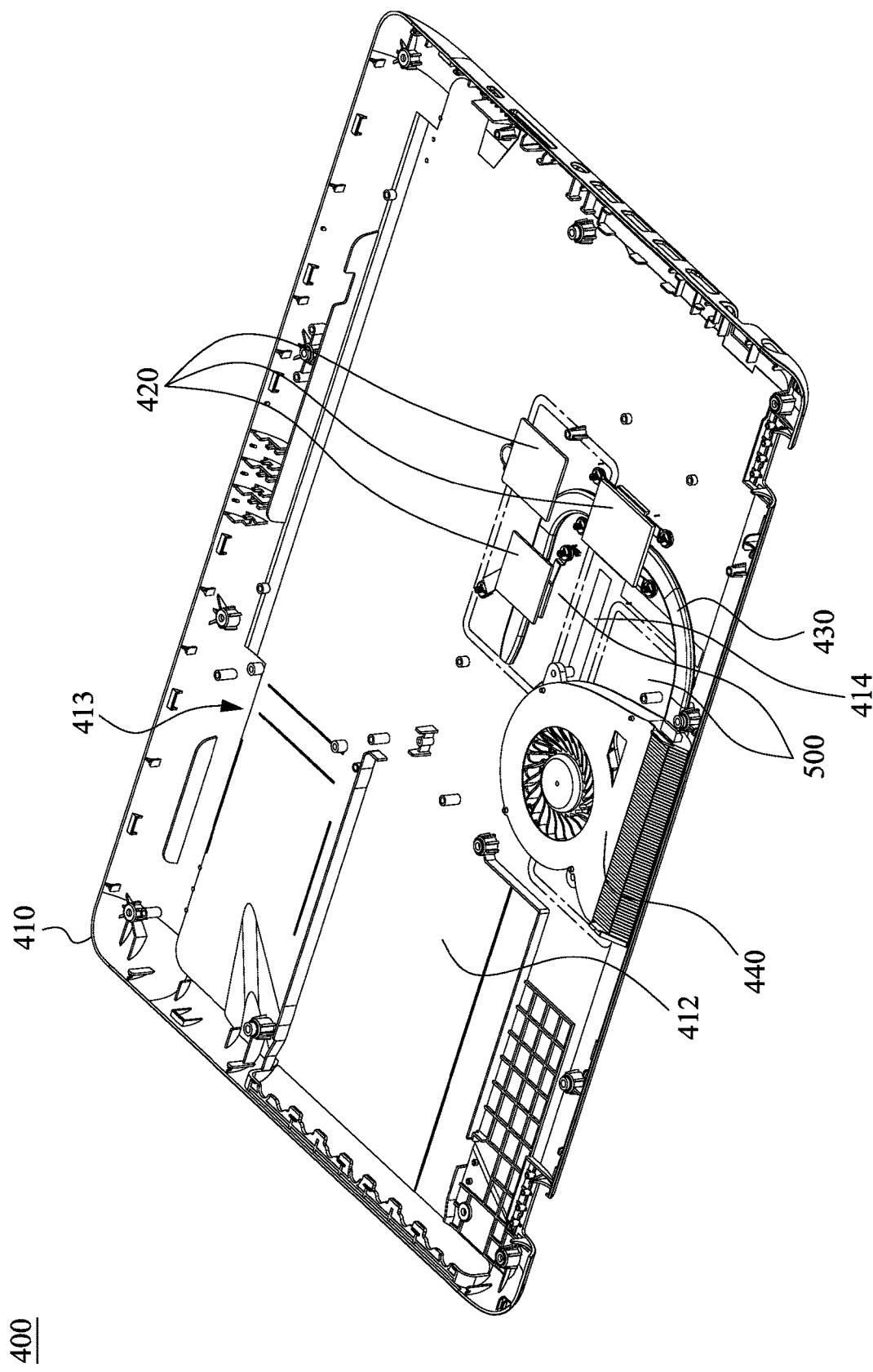
FIG. 7 is a schematic view illustrating a thermal isolation plate of FIG. 3 additionally installed with a fan element.

In the embodiment, FIG. 7 is a schematic view illustrating a thermal isolation plate of FIG. 3 additionally installed with a fan element 440 beyond. As shown in FIG. 2 and FIG. 7, the housing 410 further includes two air inlets 414. Each of the air inlets 414 penetrates through the inner surface 412 and the outer surface 411 of the housing 410, and each of the air inlets 414 is facing or adjacent to the heat radiation fins 541. The electrical device 100 further comprises a fan element 440. The fan element 440 is disposed in the accommodation space 413, and is facing or adjacent to the heat-conductive member 430 (e.g., heat pipe), and draws airflows from the air inlets 414 into the accommodation space 413 for cooling down the heat radiation fins 541.

Therefore, after the heat from the heat-conductive member 430 is conducted to the first plate body 510 of the thermal isolation plate 500, most of the heat will move towards the heat radiation fins 541 so as to reduce the heat moving to the second plate body 520 and the outer surfaces 411 of the housing 410 so as to thermally isolate the heat from the outer surfaces 411 of the housing 410.

Figure 8:
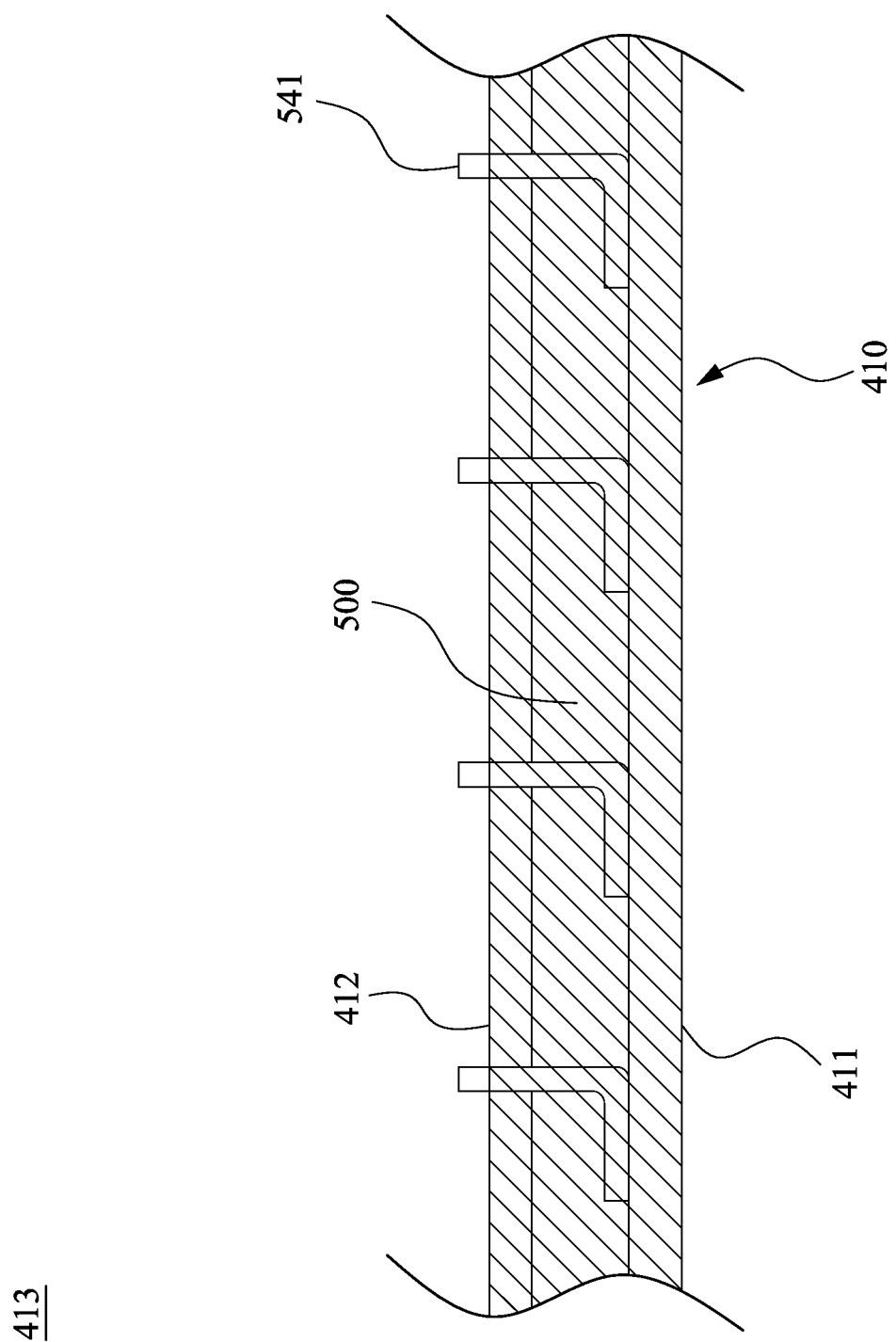
FIG. 8 is a cross sectional view of FIG. 2 taken along line BB.

FIG. 8 is a cross sectional view of FIG. 2 taken along line BB. In the embodiment, in order to prevent from shrinking the configuration space of the internal electronic components by occupying the accommodation space 413, as shown in FIG. 3 and FIG. 8, after the thermal isolation plate 500 is wrapped by injecting melted plastic material during an insert molding process, the thermal isolation plate 500 is partially embedded in the housing 410 so that the thermal isolation plate 500 is wrapped by the housing 410, and is disposed between the inner surface 412 and the outer surface 411 of the housing 410. At this point, the thermal isolation plate 500 is facing or adjacent to the heat-conductive member 430 (e.g., heat pipe), more specifically, a part of an orthographic of the heat-conductive member 430 is overlapped on the thermal isolation plate 500.

Also, since the thermal isolation plate 500 is embedded inside the solid wall of the housing 410, the heat radiation fins 541 are partially disposed in the solid wall of the housing 410, and the heat radiation fins 541 extend into the accommodation space 413 in the housing 410 through the inner surface 412 thereof.

The heat radiation fins 541 also can increase the binding force coupling the plastic material (i.e., housing 410) and metal (i.e., thermal isolation plate 500) by the insert molding process. However, the disclosure is not limited thereto, in other embodiments, the thermal isolation plate 500 is not embedded in the housing 410, for example, the thermal isolation plate 500 is directly attached on the inner surface 412 of the housing 410.

In one specific embodiment, the material of the housing 410 is not only limited to plastic material, the housing 410 also can be made of metal (e.g., aluminum alloy or magnesium alloy) instead. When the housing 410 is made of metal (e.g., aluminum alloy or magnesium alloy), the thermal isolation plate 500 can be coupled in the housing 410 or on the inner surface of the housing 410 by riveting or adhering methods. However, the disclosure is not limited thereto.

Figure 9:
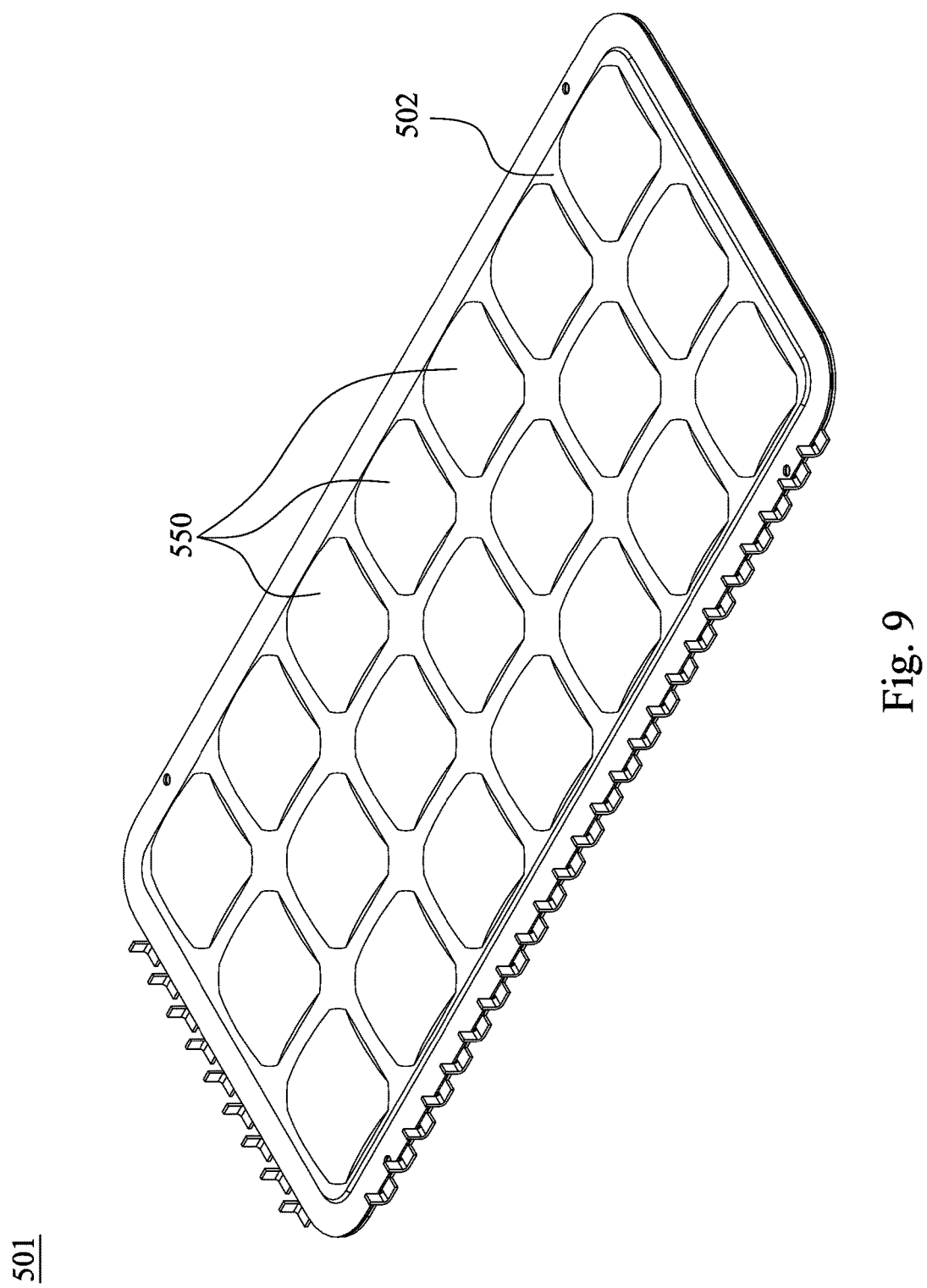
FIG. 9 is a perspective view of a thermal isolation plate according to another embodiment of the disclosure.

FIG. 9 is a perspective view of a thermal isolation plate 501 according to another embodiment of the disclosure. In this embodiment, refer to FIG. 9, the thermal isolation plate 501 includes a plurality of protruding portions 550. The protruding portions 550 are arranged on the top surface 502 of the thermal isolation plate 501 so as to avoid the thermal isolation plate 501 being sunken toward a center area thereof.

In the aforementioned process of the thermal isolation plate, the method to hermetically seal the edges of the second plate body 520 and the edges of the first plate body 510 together to form the vacuum chamber includes steps as below.

First, in step 1, as shown in FIG. 4 and FIG. 6, a first plate body 510 and a second plate body 520 are respectively formed. For example, the first plate body 510 and the second plate body 520 are respectively formed through a stamping process. In one specific embodiment, the periphery edges of the first plate body 510 and the periphery edges of the second plate body 520 are respectively provided with capillary structures 560 thereon. Each of gaps of the capillary structures 560 is approximated to 0.05 mm-0.15 mm. In step 2, a solder material (e.g., copper or tin solder) is arranged between the first plate body 510 and the second plate body 520, and is filled in the gaps between the capillary structures 560, respectively. In step 3, the first plate body 510 is covered on the second plate body 520 in which an air-exhausting pipe 570 is placed between the first plate body 510 and the second plate body 520 (FIG. 6). In step 4, the solder material is melted to mutually bond the first plate body 510 and the second plate body 520 together so that an interspace which is not vacuum yet is defined between the first plate body 510 and the second plate body 520. In step 5, air in the interspace is retracted outwards from the interspace under a degree of at least less than $10^{-3}$ torrs pressure by a vacuum pump. In step 6, the air-exhausting pipe 570 is mechanically squashed to seal the nozzle of the air-exhausting pipe 570, and the sealed nozzle of the air-exhausting pipe 570 is then welded.

However, the disclosure is not limited thereto, in other embodiments, after step 2, the method can go step 3a in which the first plate body 510 is covered on the second plate body 520, and both of the first plate body 510 and the second plate body 520 are moved into a vacuum oven, and the vacuum oven first produces a vacuum in the inner space of the vacuum oven under a degree of at least less than $10^{-3}$ torrs pressure, and the vacuum oven then heats the inner space of the vacuum oven to a solder melting temperature (e.g., 430□) for melting the solder material to mutually bond the first plate body 510 and the second plate body 520 together so that the vacuum chamber 530 is therefore defined between the first plate body 510 and the second plate body 520.

Even though the aforementioned steps suggests that the thermal isolation plate 500 is configured between the inner surface 412 of the bottom piece 410B of the housing 410 and the heat-conductive member 430 so as to avoid an arm or a leg of the user being burned by the outer surface 411 of the housing 410. However, the disclosure is not limited to arrange the thermal isolation plate 500 between the inner surface 412 thereof and the heat-conductive member 430 only. In one specific embodiment, the outer surface 411 of the housing 410 of the electrical device 100 can be, for example, a palm rest area, a keyboard, a hard disk driver (HDD) drive external cover, a compact disc read-only memory (CD-ROM) drive external cover, and the like. Moreover, the electrical device of the disclosure is not limited to types and formations; for example, the electrical device can be a laptop computer, a smart mobile phone or a tablet computer. Even though the electrical device of the disclosure is examplified as a laptop computer in the afore- mentioned embodiment, however, the electrical device of the disclosure is not only limited to the laptop computer only.

To sum up, by thermally blocking the heat to the outer surface of the electrical device with the thermal isolation plate of the disclosure, when a user is in contact with the outer surface of the electrical device, the user will not feel the heat from the outer surface of the electrical device so as to prevent the human skin from being hurt.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An electrical device having thermal isolation function, comprising:

a housing comprising a top piece, a bottom piece and an accommodation space defined between the top piece and the bottom piece, the bottom piece comprising a solid wall provided with an inner surface and an outer surface which is opposite to the inner surface, wherein the inner surface is arranged between the accommodation space and the outer surface;

a heat-generating source disposed in the accommodation space;

a heat-conductive member disposed in the accommodation space, and being in contact with the heat-generating source;

a thermal isolation plate wrapped by the solid wall of the bottom piece to be embedded inside the solid wall of the bottom piece and disposed between the inner surface and the outer surface thereof, and a surface of the thermal isolation plate being in direct contact with the solid wall of the bottom piece, wherein a part of an orthographic of the heat-conductive member to the solid wall overlaps with the thermal isolation plate, and the thermal isolation plate comprises a first plate body, a second plate body and a plurality of heat radiation fins directly formed on the second plate body, edges of the second plate body and edges of the first plate body are hermetically sealed with each other to form a vacuum chamber between the first plate body and the second plate body, and the heat radiation fins extend into the accommodation space from the second plate body through the inner surface thereof, wherein a space of the vacuum chamber from which air has been fully removed, and a part of each of the heat radiation fins is partially disposed in the solid wall of the second plate body, and another part of each of the heat radiation fins is disposed in the accommodation space.

2. The electrical device having thermal isolation function according to claim 1, wherein the heat radiation fins are arranged on a lateral edge of the thermal isolation plate.

3. The electrical device having thermal isolation function according to claim 1, wherein the heat radiation fins are arranged on a main surface of the thermal isolation plate.

4. The electrical device having thermal isolation function according to claim 1, further comprising:

at least one air inlet penetrating through the inner surface and the outer surface of the housing, and being adjacent to the heat radiation fins.

5. The electrical device having thermal isolation function according to claim 4, further comprising:
a fan element disposed in the accommodation space for drawing airflows from the at least one air inlet into the accommodation space for cooling the heat radiation fins.

6. The electrical device having thermal isolation function according to claim 1, wherein the thermal isolation plate is provided with a plurality of protruding portions arranged on one surface of the thermal isolation plate.

* * * * *